(12) United States Patent
Braun

(10) Patent No.: US 10,447,279 B1
(45) Date of Patent: Oct. 15, 2019

(54) INVERTING PHASE-MODE LOGIC FLIP-FLOPS

(71) Applicant: Alexander Louis Braun, Baltimore, MD (US)

(72) Inventor: Alexander Louis Braun, Baltimore, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 16/205,959

(22) Filed: Nov. 30, 2018

(51) Int. Cl.
*H03K 19/195* (2006.01)
*H03K 19/23* (2006.01)

(52) U.S. Cl.
CPC ......... *H03K 19/1954* (2013.01); *H03K 19/23* (2013.01)

(58) Field of Classification Search
None
See application file for complete search history.

(56) References Cited

U.S. PATENT DOCUMENTS

| 7,724,020 | B2 * | 5/2010 | Herr ...................... B82Y 10/00 326/3 |
| 9,812,192 | B1 * | 11/2017 | Burnett ................. G11C 11/44 |
| 10,171,087 | B1 * | 1/2019 | Braun ................ H03K 19/1954 |
| 2009/0002014 | A1 * | 1/2009 | Gupta ..................... H03F 19/00 326/3 |
| 2013/0040818 | A1 * | 2/2013 | Herr ......................... H03K 3/38 505/190 |

* cited by examiner

*Primary Examiner* — Minh D A
*Assistant Examiner* — James H Cho
(74) *Attorney, Agent, or Firm* — Tarolli, Sundheim, Covell & Tummino LLP

(57) ABSTRACT

An inverting reciprocal quantum logic (RQL) phase-mode D flip-flop accepts a data input and a logical clock input. The flip-flop includes a stacked Josephson junction and a comparator. The triggering or untriggering of the stacked Josephson junction by positive or negative single flux quantum (SFQ) pulses can switch a direction of DC bias current through a component of the comparator, such as an output Josephson junction, which can then either pass or suppress logical clock SFQ pulses. When so passed, the data input is captured to the output upon clocking the flip-flop via the provision of the logical clock SFQ pulses, e.g., as reciprocal pulse pairs.

20 Claims, 14 Drawing Sheets

INVERTING PHASE-MODE LOGIC FLIP-FLOPS

TECHNICAL FIELD

The present invention relates generally to quantum and classical digital superconducting circuits, and specifically to inverting phase-mode logic (PML) D flip-flops.

BACKGROUND

In the field of digital logic, extensive use is made of well known and highly developed complimentary metal-oxide semiconductor (CMOS) technology. As CMOS has begun to approach maturity as a technology, there is an interest in alternatives that may lead to higher performance in terms of speed, power dissipation computational density, interconnect bandwidth, and the like. An alternative to CMOS technology comprises superconductor based single flux quantum circuitry, utilizing superconducting Josephson junctions (JJs), with typical signal power of around 4 nanowatts (nW), at a typical data rate of 20 gigabits per second (Gb/s) or greater, and operating temperatures of around 4 kelvins.

A flip-flop is a bistable multivibrator, a two-stable-state circuit that can therefore be used to store state information and to change state by signals applied to one or more control inputs. In modern computing and communications electronics, flip-flops are the basic storage element in sequential logic. An inverting flip-flop is one that delivers the inverse logic state that would otherwise be expected from a noninverting flip-flop, i.e., the output is an inverted version of the clocked input. A conventional inverting D flip-flop, e.g., one implemented in CMOS, has two binary inputs, a data input D and a clock input, and at least one output, Q. The D flip-flop captures the value of the D input at a definite portion of an input clock cycle, e.g., a rising edge or a falling edge, known as the capture time. That captured value is inverted to become the Q output. The output Q does not change except at the capture time (or some small propagation delay thereafter). In practical implementations it is required that a data input D be stable for some setup time prior to the capture time and for some hold time after the capture time for the input to be reliably captured, inverted, and propagated to the output.

Phase-mode logic allows digital values to be encoded as superconducting phases of one or more Josephson junctions. For example, a logical "1" may be encoded as a high phase and a logical "0" may be encoded as a low phase. For example, the values may be encoded as a superconducting phase of zero radians (meaning, e.g., logical "0") or as a superconducting phase of $2\pi$ radians (meaning, e.g., logical "1"). These values persist across RQL AC clock cycles because there is no requirement for a reciprocal pulse to reset the Josephson junction phase each AC clock cycle.

SUMMARY

One example includes an inverting reciprocal quantum logic (RQL) phase-mode flip-flop. The flip flop has a stacked Josephson junction configured to receive a data input signal on a data input line as a positive or a negative single flux quantum (SFQ) pulse and to reverse a DC bias current flowing in the flip-flop based on the data input signal. The flip-flop further has a comparator configured to receive a logical clock input signal and to either transmit the logical clock input signal on an output line as an output signal of the flip-flop, the output signal being a logical inversion of the data input signal, or to suppress such transmission, based on the direction of the DC bias and a logical output state of the flip-flop. For example, the logical output state can be a "phase mode one" state corresponding, for example, to a logical "1," or a "phase mode zero" state corresponding, for example, to a logical "0."

Another example includes a method of operating (e.g., of writing and reading a logical value to and from) an inverting reciprocal quantum logic (RQL) flip-flop. The method includes initializing an inverting reciprocal quantum logic (RQL) flip-flop with a logical clock reciprocal pulse pair to set the flip-flop to a phase mode corresponding to a logical "1" value. The method continues by providing a positive single flux quantum (SFQ) pulse to a data input of the flip-flop, and by triggering a stacked Josephson junction in the flip-flop to reverse the direction of a DC bias current flowing through an output Josephson junction in flip-flop. The method continues by providing a further reciprocal SFQ pulse pair to a logical clock input of the flip-flop. The method continues by passing only the negative pulse of the further pulse pair to the output of the flip-flop, based on the reversed DC bias, and absorbing the positive pulse of the further pulse pair with either an escape Josephson junction or a dissipation resistor. The result of the above is that the flip-flop is reset to a phase mode corresponding to a logical "0" value. The method can continue by providing a negative SFQ pulse to the data input of the inverting RQL flip-flop, untriggering the stacked Josephson junction to restore the previously reversed direction of the DC bias current, and providing a subsequent reciprocal SFQ pulse pair to the logical clock input of the flip-flop. The method can further include passing only a positive pulse of the subsequent pulse pair to the output of the flip-flop, based on the restored DC bias, and absorbing the negative pulse of the subsequent pulse pair with an escape Josephson junction or resistor. The result of this is that the flip-flop is set to a phase mode corresponding to a logical "1" value.

Yet another example includes a circuit having a data input configured to receive a data input signal as single flux quantum (SFQ) pulses, and a logical clock input configured to receive a logical clock input signal as reciprocal pairs of positive and negative SFQ pulses. The circuit also includes either an escape Josephson junction or a resistor connected between the logical clock input and an output. The circuit further has an output Josephson junction connected between the output and a circuit ground, and a stacked Josephson junction connected between the data input and the output. The circuit also includes a DC and AC bias network configured to supply DC and AC bias to the output Josephson junction, the DC bias being reversible by the triggering of the stacked Josephson junction. The circuit is configured to provide an output signal corresponding to a logical "1" or logical "0" value out of an output, the output signal being an inverted version of the data input signal as clocked by the logical clock input signal.

BRIEF DESCRIPTION OF THE DRAWINGS

FIG. 6 is a circuit diagram of one example of a DC bias element.

DETAILED DESCRIPTION

This disclosure relates generally to quantum and classical digital superconducting circuits, and specifically to an inverting D flip-flop for use in reciprocal quantum logic (RQL) phase-mode logic (PML) circuits. The RQL phase-mode inverting flip-flop can be implemented, for example, in a memory system (e.g., a quantum computing memory system) to store a logic state of an addressed memory cell. This disclosure provides an inverting version of the PML flip-flop described in U.S. patent application Ser. No. 15/810,860, entitled "RQL Phase-Mode Flip-Flop," incorporated by reference herein, that is more efficient than simply attaching an inverter to the output of that flip-flop. The inputs and the output can each be provided via a Josephson transmission line (JTL), such as in an RQL superconducting circuit.

An inverting RQL phase-mode flip-flop can include a stacked Josephson junction and a comparator. For example, such a flip-flop can include a stacked Josephson junction in series with an output Josephson junction that forms part of the comparator. As used herein, "stacked Josephson junction" means a Josephson junction that is between another Josephson junction and its bias source such that the two junctions are biased in series and the triggering of one junction can change the DC bias of the other. An output of the flip-flop can be connected, for example, to an output amplifying Josephson transmission line (JTL) so as to propagate the output signal to other gates in the RQL system or other parts of the RQL circuit. A data input, which can be provided as a positive or negative single flux quantum (SFQ) pulse, can trigger or untriggers the stacked Josephson junction to change a bias condition in the flip-flop, e.g., to reverse a DC bias applied to the output Josephson junction, thereby priming the output Josephson junction to pass pulses from a logical clock input signal to the output, or to suppress such pulses, based, for example, on the direction of the DC biasing. In this manner, an inverted version of the data input can be captured to the output upon the receipt of a logical clock SFQ reciprocal pulse pair to the comparator, when, for example, one of the pulses in the pair can cause the output Josephson junction to preferentially trigger over an escape Josephson junction in the comparator, owing to the output Josephson junction having been appropriately biased by the triggering of the stacked Josephson junction.

Figure 1:
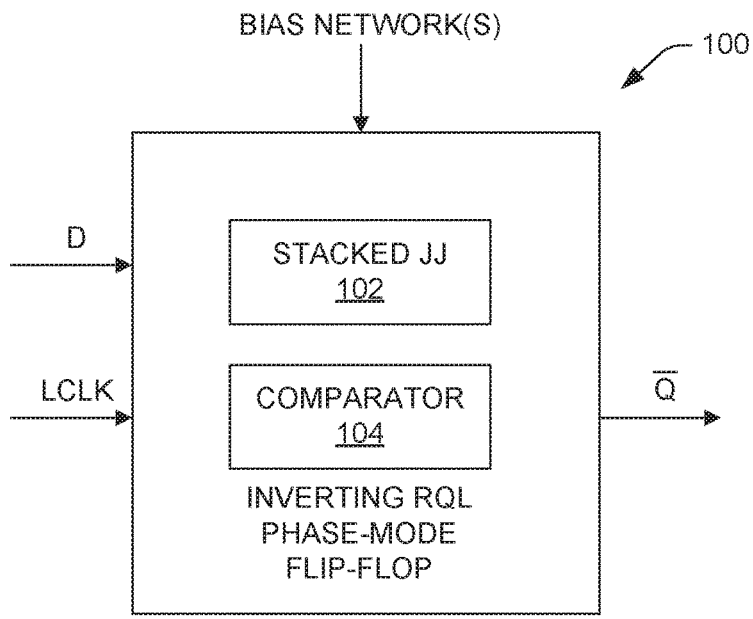
FIGS. 1 and 2 are block diagrams of example inverting reciprocal quantum logic (RQL) phase-mode D flip-flops.

FIG. 1 is a block diagram of an example inverting RQL phase-mode flip-flop 100 having data input D, logical clock input LCLK, and output Q. One or more bias network(s) can provide DC and AC bias, or DC (only) bias to the flip-flop. The flip-flop 100 includes a stacked Josephson junction 102 and a comparator 104. Stacked Josephson junction 102 can be configured to receive a data input signal on a data input line D as a positive or a negative SFQ pulse, and to reverse a DC bias current flowing in the flip-flop based on the data input signal. Comparator 104 can be configured to receive a logical clock input signal provided on logical clock input line LCLK and to either transmit the logical clock input signal on an output line as an output signal of the flip-flop, the output signal being a logical inversion of the data input signal, or to suppress such transmission, based on the direction of the DC bias and a logical output state of the flip-flop. The D and LCLK inputs and Q output follow the traditional inverting flip-flop nomenclature, with logical clock input LCLK being the equivalent of clock CLK in a CMOS flip-flop. Logical clock input LCLK can provide an SFQ signal, e.g., as positive-negative reciprocal pulse pairs, and should not be confused with an RQL AC clock.

Figure 2:
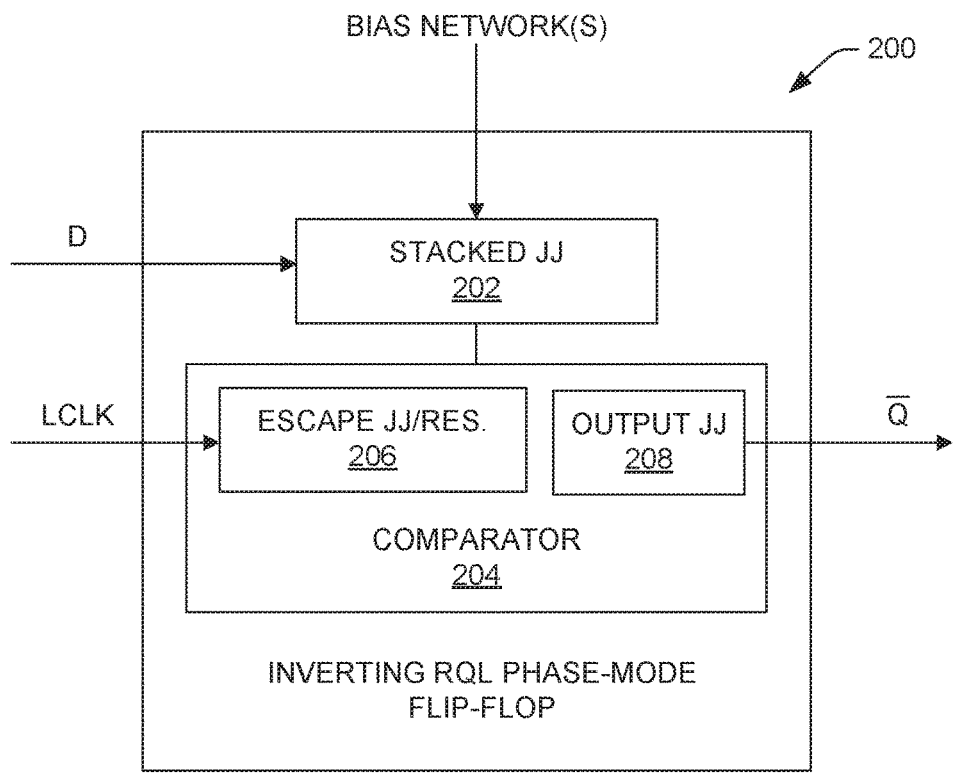

FIG. 2 is a block diagram of another example inverting RQL phase-mode flip-flop 200, similar to flip-flop 100 shown in FIG. 1. Flip-flop 200 likewise has data and logical clock inputs D and LCLK, and output Q, as well as one or more bias network(s), as described above. Flip-flop 200 also includes a stacked Josephson junction 202, which can function as described above, and a comparator 204, which can be made of either an escape Josephson junction 206 or a small dissipating resistor 206, and an output Josephson junction 208. As shown, the logical clock signal can be provided through the escape Josephson junction 206 or dissipating resistor 206, and output Josephson junction 208 is connected to the flip-flop's output. Comparator 204 can be configured such that only one of the escape Josephson junction 206 or the output Josephson junction 208 triggers in response to an SFQ pulse received at logical clock input LCLK. In particular, comparator 204 can be configured such that output Josephson junction 208 preferentially triggers to generate the output signal based on a negative bias condition of output Josephson junction 208 resulting from a triggering of stacked Josephson junction 202, reversing the DC bias current in response to the data input signal supplied at data input D. Inverting flip-flop 200 combines the use of the stacked Josephson junction 202 to reverse the direction of DC bias to output Josephson junction 208 with the comparator 204 to provide an inverted flip-flop 200.

For example, SFQ pulses arriving at input D can consist of alternating positive and negative SFQ pulses consistent with RQL phase-mode data encoding. Flip-flops 100 and 200 can each be configured, e.g., by a circuit initialization, such that if a negative data input pulse is received at data input D, on the next logical clock input signal received at logical clock input LCLK, output Q is asserted to its logical "1" value; and, by contrast, is a positive data input pulse is received at data input D, on the next logical clock input signal received at logical clock input LCLK, output Q is de-asserted to its logical "0" value. In such an example, any other combination of signals will have no effect on the logical state of output Q. Thus, for example, any pulses received at logical clock input LCLK, whether positive or negative, will not change the logical state of output Q absent a data input pulse received at input D that is different in polarity from the last received data input pulse. The aforementioned initialization can comprise provision of a reciprocal pulse pair to logical clock input LCLK.

Owing to their respective configurations, both omitting any kind of second signal-inversion stage, flip-flops 100 and 200 can be made very efficient in terms of component count and very fast in terms of output propagation speed. As examples, these flip-flops can be made with only three or four Josephson junctions, and can provide an output within one AC cycle as supplied by bias network(s). In some examples, the inverting flip-flops described herein involve less than ten picoseconds of delay from the application of a pulse at a logical clock input LCLK to a new output being generated, with it taking only a little over half an AC cycle to fully evaluate a new output when a reciprocal pair applied at LCLK to evaluate all possible transitions are about one half of an AC cycle apart.

The logic value of flip-flops 100 or 200 can be stored, for example, as the superconducting phase of a Josephson junction. For example, the logic value of flip-flop 200 can be stored as the phase of output Josephson junction 208. As an example, a 0 radian superconducting phase of output Josephson junction 208 can encode a logic "0" value and a $2\pi$ radian superconducting phase of output Josephson junction 208 can encode a logic "1" value, but other combinations can work equally well depending on the surrounding logic.

Figure 3A:
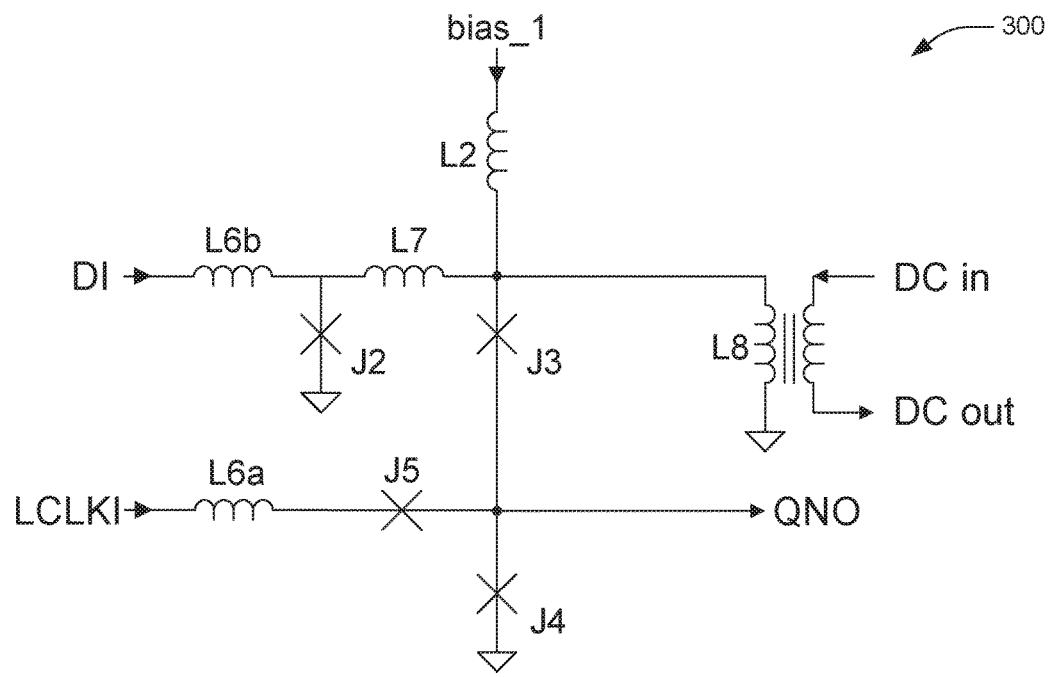
FIG. 3A is a circuit diagram of an example inverting RQL phase-mode D flip-flop.

FIG. 3A is a circuit schematic of an example RQL phase-mode inverting D flip-flop circuit 300 that can correspond to either of flip-flops 100 or 200. Flip-flop 300 has two logical inputs DI, LCLKI and one output QNO, each configured to receive or transmit SFQ pulses as inputs or outputs. A data signal consisting of positive and negative SFQ pulses can be provided on data input DI via data input inductor L6b, while a logical clock signal consisting of reciprocal SFQ pulse pairs can be provided on logical clock input LCLKI via logical clock input inductor L6a.

An AC and DC bias, labeled bias_1, can be provided to the circuit via AC and DC bias inductor L2. A DC bias can also be applied via a transformer coupling grounded inductor L8. As an example, AC and DC bias bias_1 can provide $\Phi_0/2$ worth of direct current plus an AC waveform signal (e.g., a sinusoidal signal), while the DC bias provided through inductor L8 can provide $\Phi_0/2$ worth of direct current. As used herein, $\Phi_0$ is one single flux quantum, equal to approximately 2.07 mA-pH. When a reciprocal pulse pair is applied at logical clock input LCLKI, the output QNO takes on the inverted value of the data input signal most recently applied at data input DI. Flip-flop 300 can include four Josephson junctions J2, J3, J4, J5, and five inductors L2, L6a, L6b, L7, L8, the latter of which is a transformer-coupled inductor. Alternate examples, described herein, can include one fewer inductor (eliminating inductor L8) and/or can eliminate one Josephson junction by including a resistor.

Inverting D flip-flop 300 is a "phase-mode" flip-flop inasmuch as the logic value of flip-flop 300 is stored as the superconducting phase of output Josephson junction J4, either 0 or $2\pi$ radians, where Josephson junction superconducting phase is defined as the time integral of voltage at every node. In accordance with flip-flop 300 being a "phase-mode" flip-flop, for any single reciprocal pulse pair provided to logical clock LCLKI, at most only a single pulse will be observed at inverting output QNO. To improve the operating margins of circuit 300, data input Josephson junction J2, along with data input inductor L6b and inductor L7, provides some isolation between the JTL (not shown) driving the data input DI and the remainder of circuit 300 (as illustrated) that performs the logic operation. As such, in some examples, data input inductor L6b data input Josephson junction J2, and inductor L7 can be considered as not a part of circuit 300 but rather as a part of the aforementioned data input driving JTL. D flip-flop 300 is therefore highly efficient in terms of its use of devices, requiring only three or four Josephson junctions and only three to five inductors, apart from any devices used for race condition avoidance phasing of input signals, and notably without requiring a separate dedicated signal inversion circuit stage.

As discussed below with regard to FIGS. 4 and 6, the DC transformer and its associated grounded inductor L8 can be omitted in some implementations, provided that the DC and AC mix provided by DC and AC bias bias_1 can be appropriately adjusted. Typical RQL circuits are designed with DC and AC bias lines that provide a certain DC and AC bias mix via transformer coupling to a grounded bias inductor, and because flip-flop 300 uses a different mix than ordinarily found in RQL circuits, DC bias transformer including inductor L8 can be advantageously included to provide a different mix while still making use of the more readily available bias from DC and AC bias source bias_1.

Although a more detailed description of the circuit's functioning is given below, a summary of the functioning of inverting flip-flop 300 is as follows. As can be seen, for example, in FIGS. 3L-3Q, the triggering of stacked Josephson junction J3 in flip-flop 300 drives one $\Phi_0$ worth of current in all directions, including up into the two bias networks, i.e., through inductors L2 and L8, and the return path for this current is up from ground through output Josephson junction J4. Thus, for example, if DC and AC bias bias_1 and DC bias inductor L8 together provide $\Phi_0/2$ of positive DC bias current flowing down into circuit 300 through inductor L2 and Josephson junctions J3 and J4 to ground at the bottom of the circuit, the triggering of Josephson junction J3, putting $\Phi_0$ of current flowing in the opposite direction reverses that whole loop, such that $-\Phi_0/2$ worth of bias current is seen by output Josephson junction J4.

Escape Josephson junction J5 and output Josephson junction J4 in circuit 300 together form a comparator, and depending on the direction of the DC bias through output Josephson junction J4, when a reciprocal pulse pair is introduced on logical clock input LCLKI, escape Josephson junction J5 either rejects the positive one of the logical clock pulses and allows the negative pulse to be passed through to the output QNO, or vice versa, with the caveat that the pulse is only passed to the output QNO provided that the output QNO is not already in the state implied by such pulse. In the case that the output QNO is already in the state that would be suggested by the passed pulse, escape Josephson junction J5 rejects both pulses of the logical clock reciprocal pulse pair. Because Josephson junction J3 is stacked with output Josephson junction J4 and triggers to reverse the bias current seen by output Josephson junction J4, the data input DI effectively applies an opposite bias to output Josephson junction J4, such that a positive pulse applied to data input DI triggers stacked Josephson junction J3 positively, and biases output Josephson junction J4 negatively. Thus, a positive input at DI allows a negative pulse to transition from logical clock input LCLKI to output QNO.

The default state of circuit 300 with respect to the DC biases provided from bias_1 and transformer-coupled inductor L8, as shown in FIG. 3A, is such that DC bias currents are provided in the positive direction, flowing from source bias_1 down through inductor L2, stacked Josephson junction J3, and output Josephson junction J4. In the circuit's default state shown in FIG. 3A and prior to a circuit initialization described below, circuit 300 is in "phase mode zero": as shown in FIG. 3A, all of the Josephson junctions attached to output QNO (J3, J4, J5) have no dot on the output side, and the phase of the output QNO is at 0 radians.

Figure 3B:
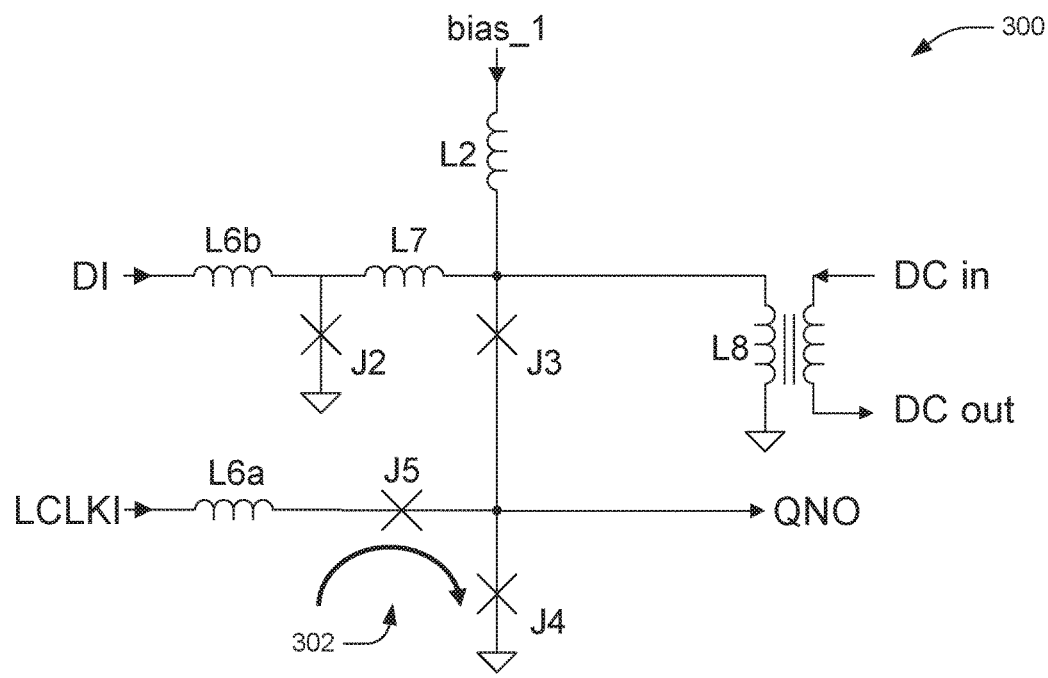
FIGS. 3B-3R illustrate example functioning of the flip-flop of FIG. 3A.
Figure 3C:
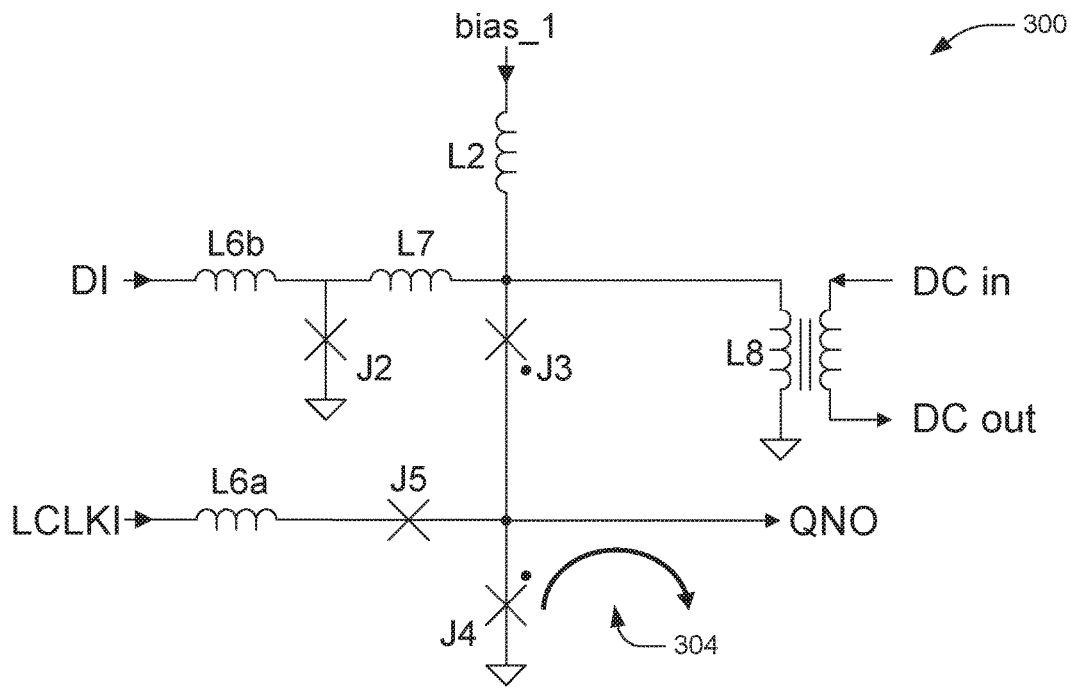
Figure 3D:
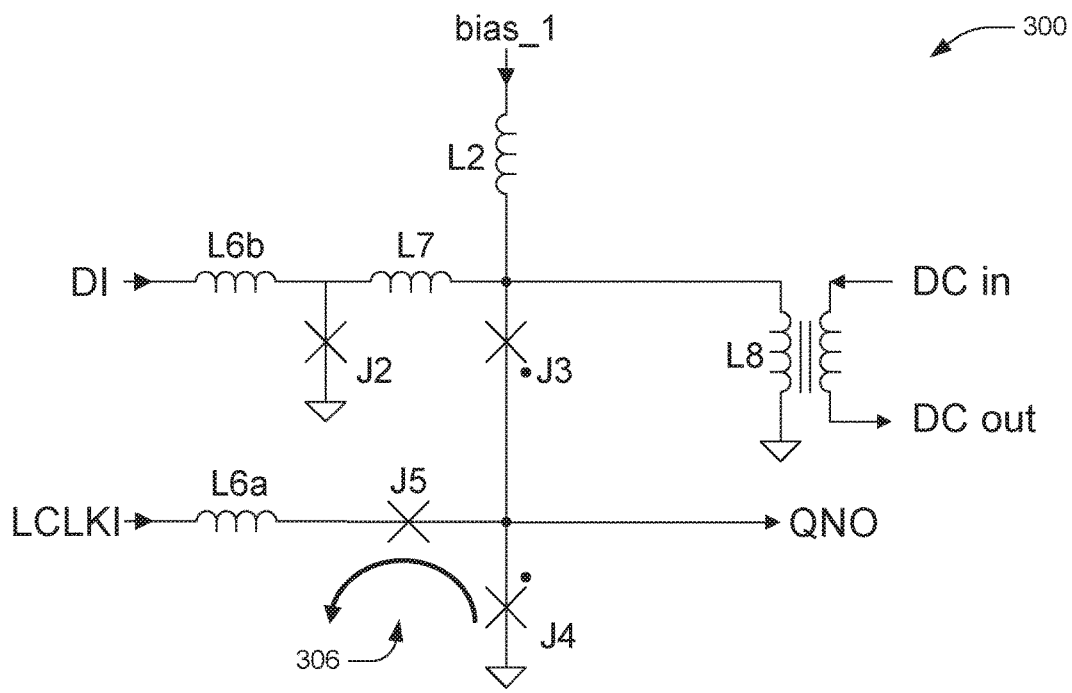
Figure 3E:
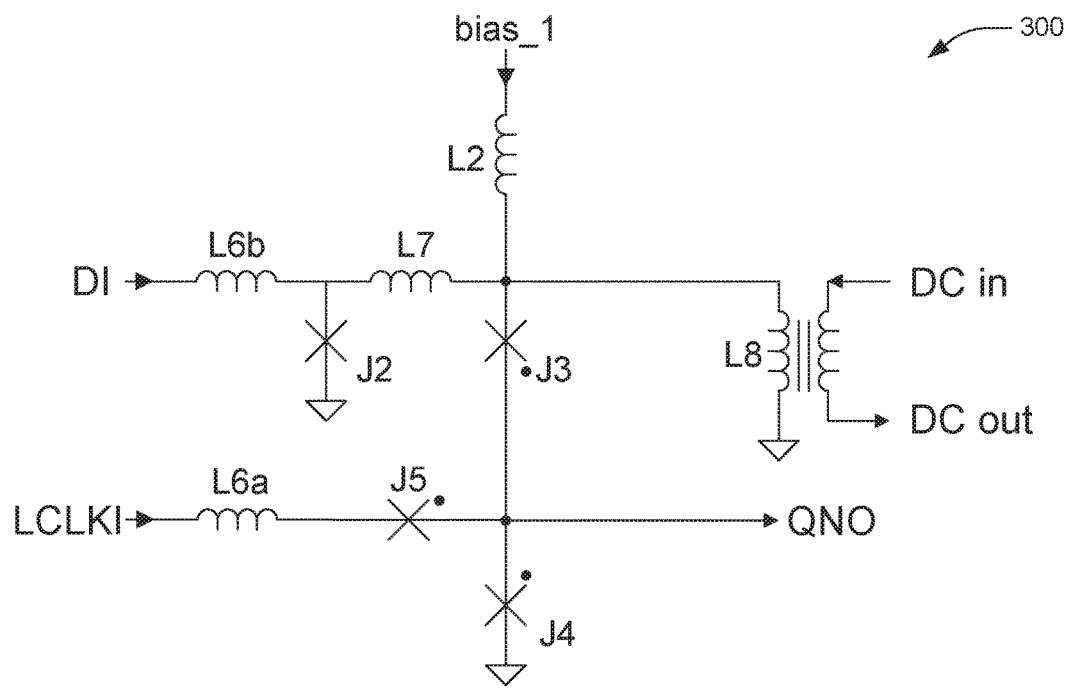
Figure 3F:
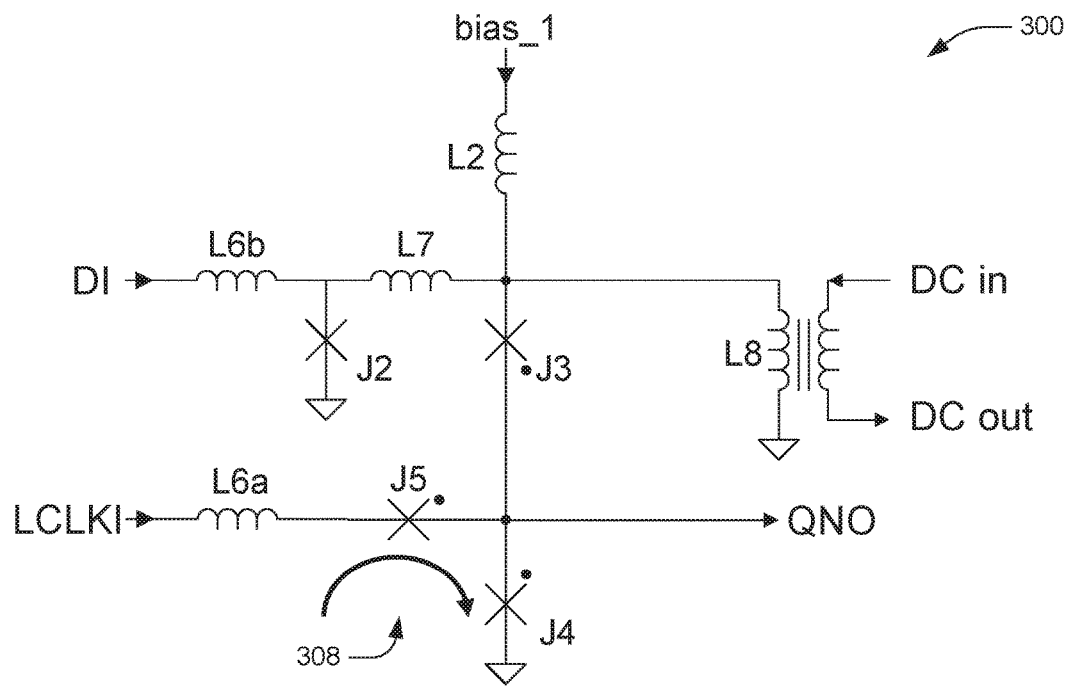
Figure 3G:
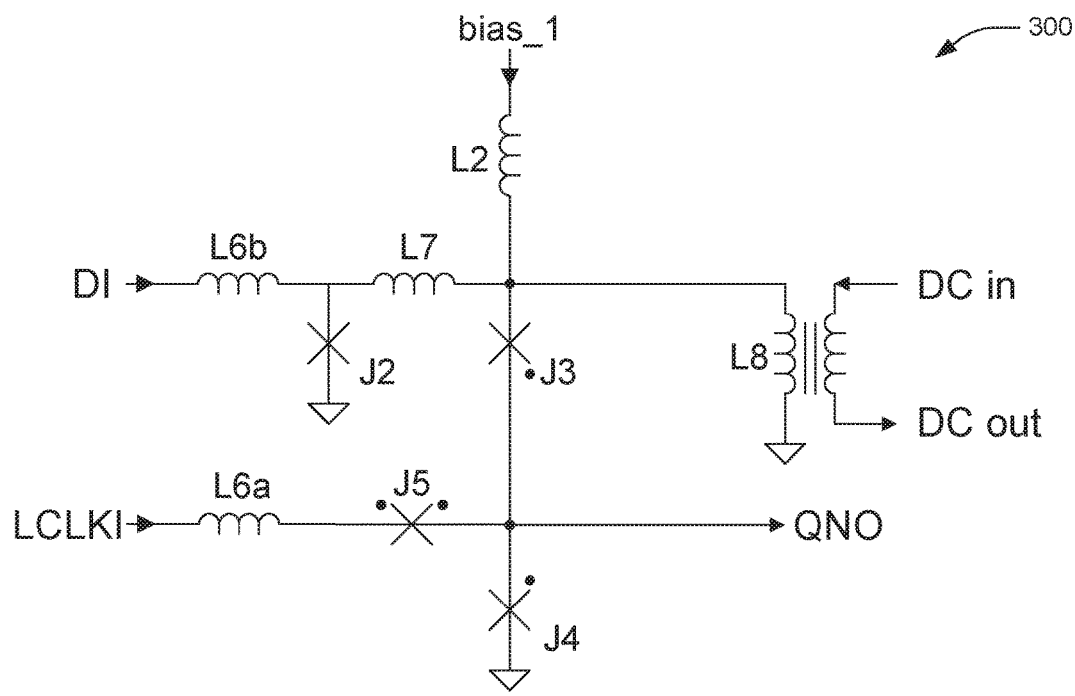
Figure 3H:
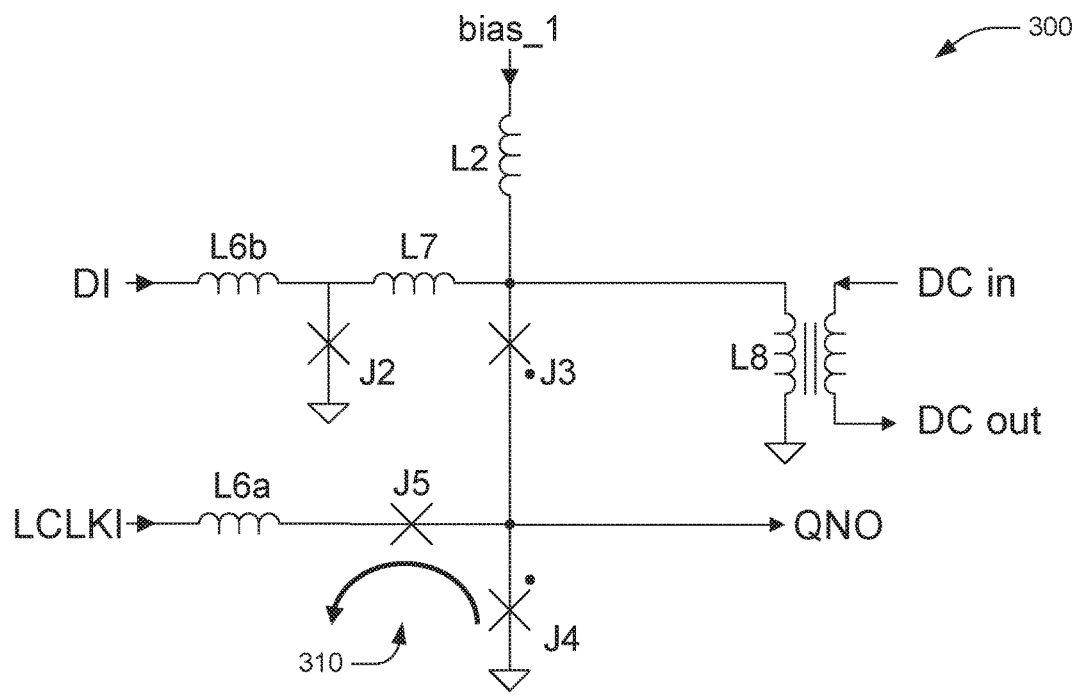
Figure 3I:
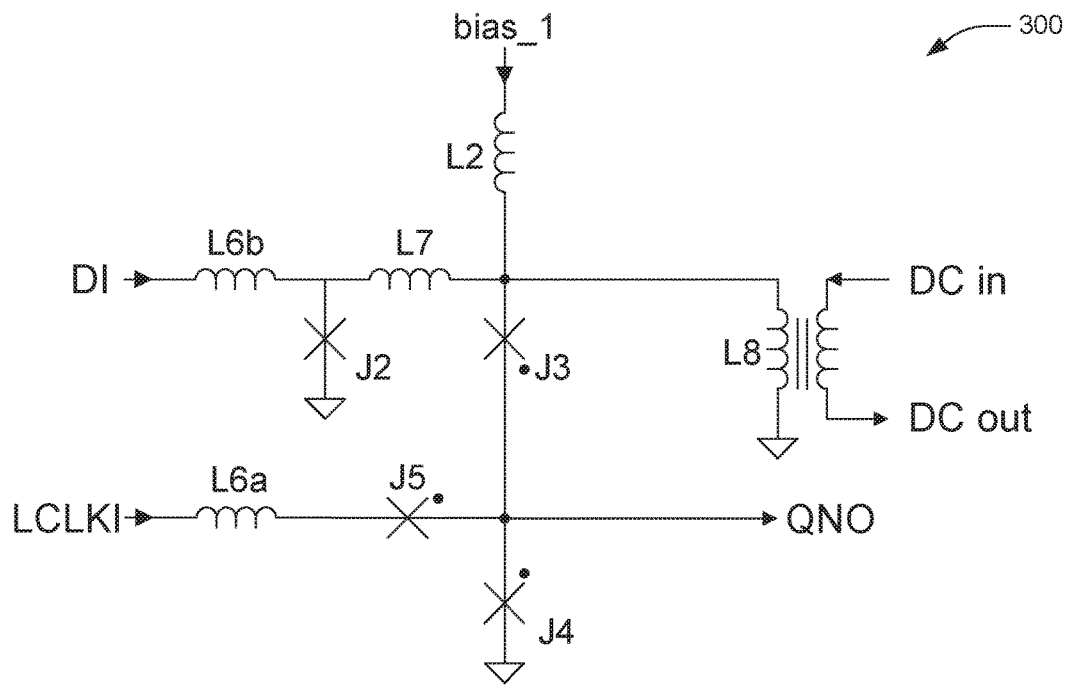
Figure 3J:
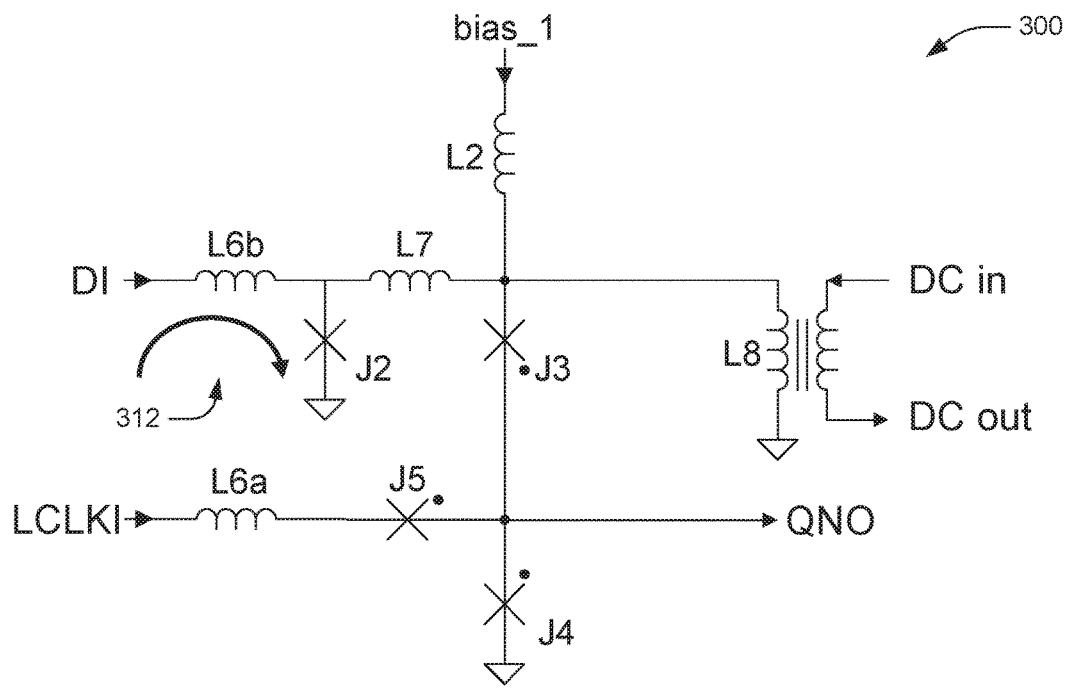
Figure 3K:
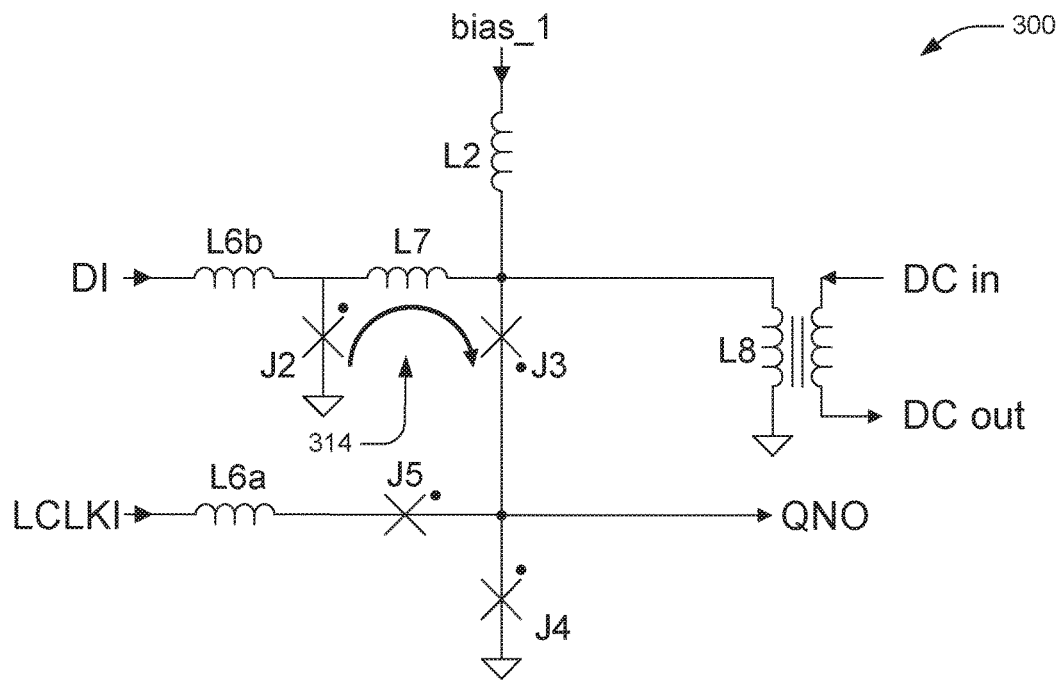
Figure 3L:
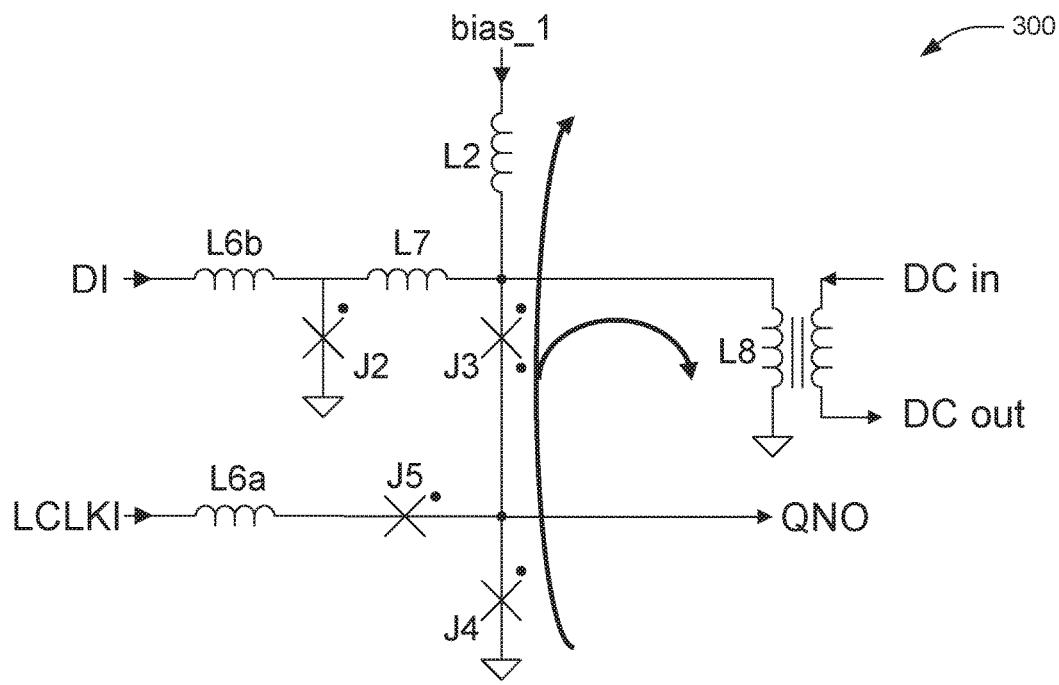
Figure 3M:
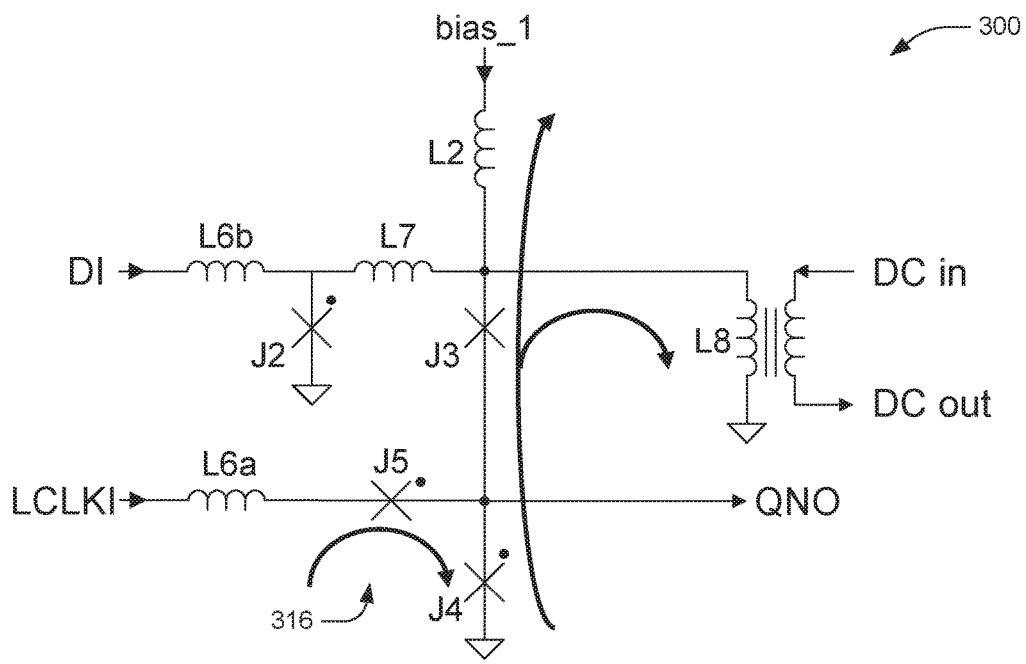
Figure 3N:
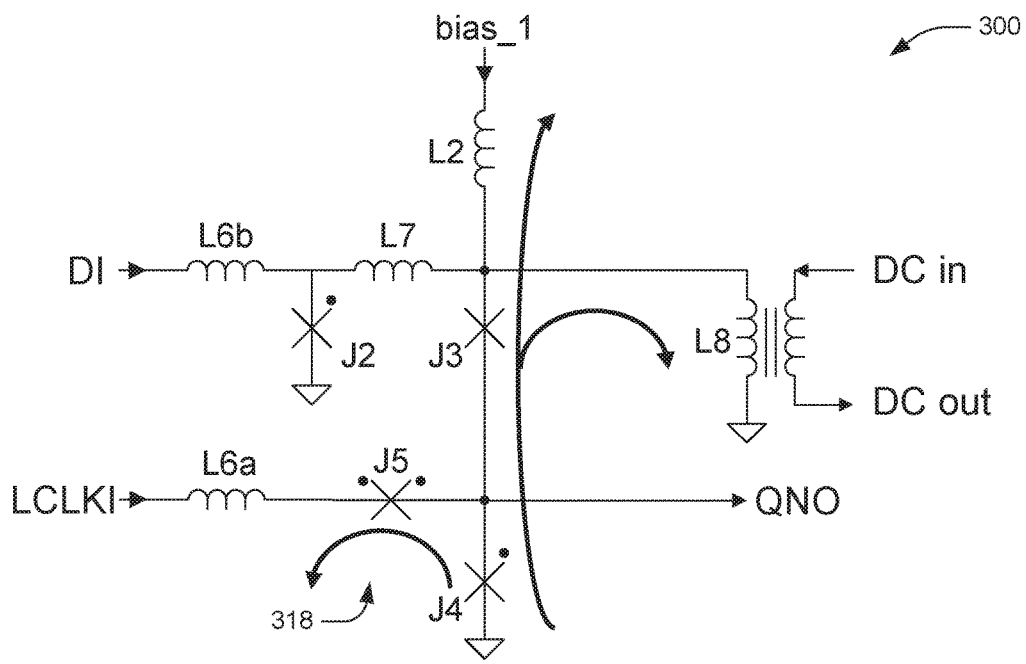
Figure 3O:
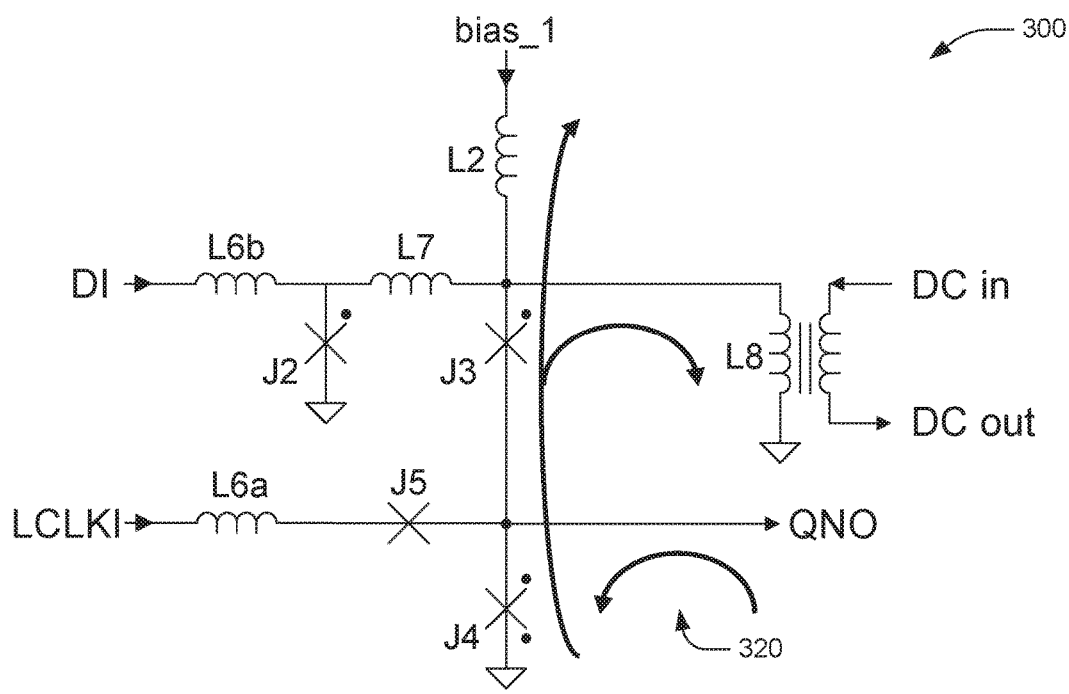
Figure 3P:
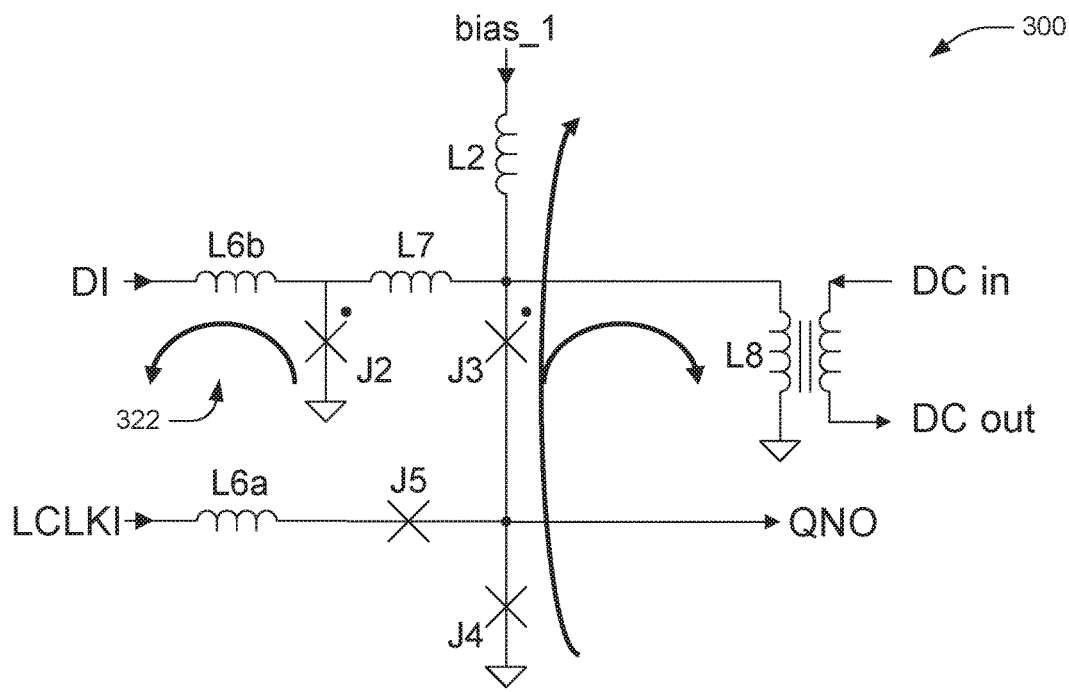
Figure 3Q:
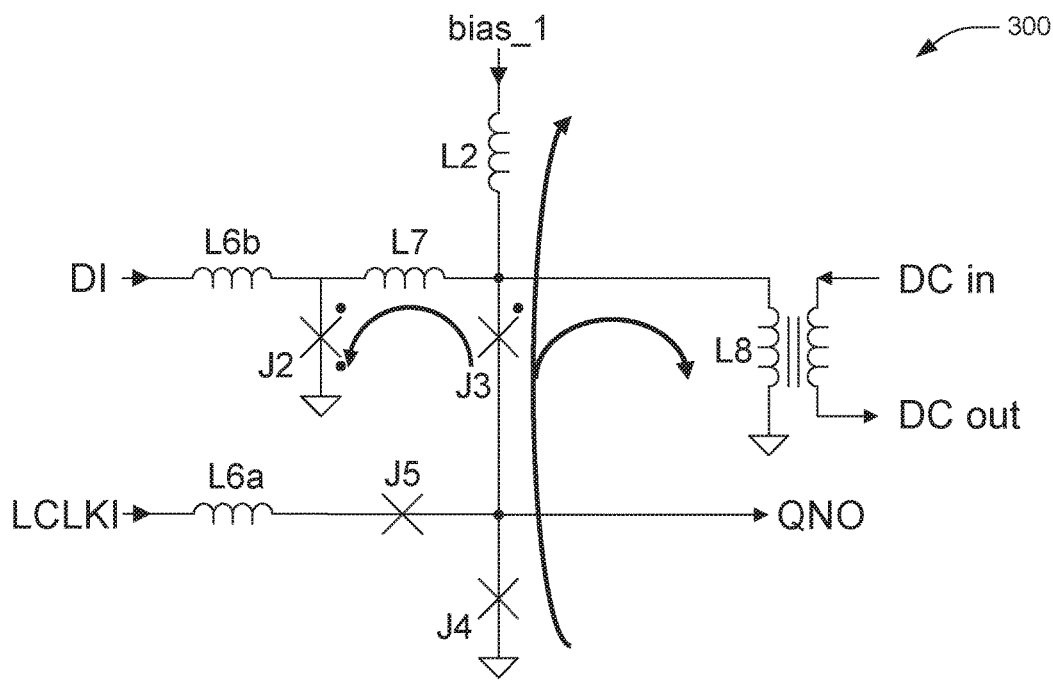
Figure 3R:
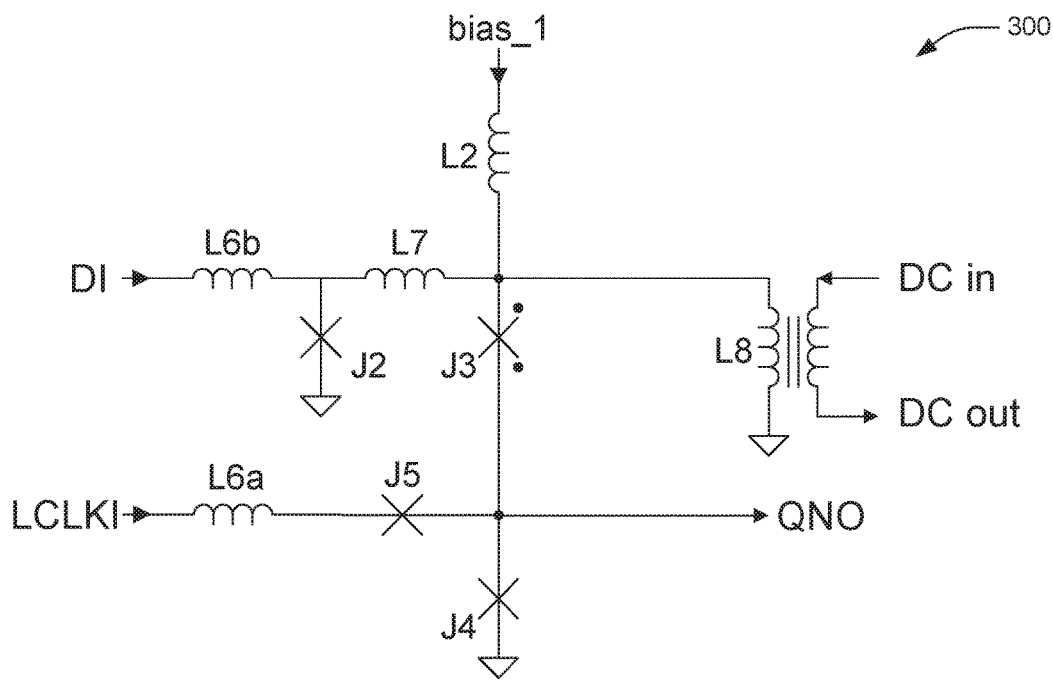

FIGS. 3B-3R illustrate the functioning of circuit 300 starting from the default biasing state of FIG. 3A. In these illustrations, a dot placed next to a Josephson junction indicates that that Josephson junction has been triggered, and the side on which said dot is placed indicates the direction of triggering. In the convention used in these illustrations, dots placed at both sides of a Josephson junction indicate successive triggering and untriggering of the Josephson junction (i.e., triggering in one direction followed by triggering in the opposite direction), which is equivalent to no dots.

Operation of flip-flop circuit 300 can include an initial reciprocal pulse pair at logical clock input LCLKI to initialize the circuit. This initializing pulse pair can consist, for example, of a positive SFQ pulse followed by a negative SFQ pulse, as illustrated in FIGS. 3B-3E, but the circuit functions equivalently if the pulse pair consists of a negative SFQ pulse followed by a positive SFQ pulse. In FIG. 3B, a positive SFQ pulse 302 is applied to the logical clock input LCLKI. This positive clock pulse triggers output Josephson junction J4 positively and also negatively triggers stacked Josephson junction J3, as indicated by the dots next to those junctions in FIG. 3C. The triggering sends a positive output pulse 304, shown in FIG. 3C, to output QNO, thereby asserting the output and initializing it to a logical "high" state, which can correspond, for example, to a logical "1" in a larger digital logic device or scheme, such as a memory.

The negative triggering of stacked Josephson junction J3 means that the triggering of Josephson junction J4 does not reverse the bias in the ground-to-bias-network loop as would be the case in most other RQL circuits. In a typical RQL circuit, a single biased Josephson junction would go to a coupled transformer that applied DC and AC and would eventually reach ground, and that would form an inductive loop; a triggering of the single Josephson junction would drive one $\Phi_0$ worth of current up into that loop, reversing the biasing seen by the single Josephson junction from $+\Phi_0/2$ to $-\Phi_0/2$. In the case of circuit 300, the presence of two Josephson junctions in the biasing loop, J3 and J4, and the triggering of J3 upon the triggering of J4, means that the current is not reversed in the loop. Thus, in flip-flop 300, the DC bias seen by output Josephson junction J4 is not reversed at this point, i.e., in FIG. 3C, because stacked Josephson junction J3 has also been triggered, and from the perspective of the ground-to-bias-network loop, the triggering of both of these Josephson junctions cancels out what would otherwise be a bias-reversing effect. Plotted in terms of phase, the node between Josephson junctions J3 and J4 is at $2\pi$ radians while both of the nodes on the opposite sides of these Josephson junctions is at 0 radians.

In FIG. 3D, the negative SFQ pulse 306 of the logical clock reciprocal pulse pair is applied at logical clock input LCLKI. Because the DC bias of output Josephson junction J4 is still positive, inhibiting a negative triggering at output Josephson junction J4, negative pulse 306 is unable to trigger output Josephson junction J4, and instead triggers escape Josephson junction J5 negatively, as shown in FIG. 3E by the dot to the right of escape Josephson junction J5. Consequently, the introduction of negative pulse 306 causes no change in the output. Thus, as shown in FIG. 3E, no pulse is propagated out of output QNO. In other words, FIG. 3E shows that negative logical clock pulse 306 has been rejected by the triggering of escape Josephson junction J5. From both of the initializing pulses 302, 306 provided to logical clock input LCKLI, only one pulse 304 has been propagated out of output QNO. The initialization being complete with the provision of both pulses of a first reciprocal pulse pair at the logical clock input LCLKI, circuit 300 is placed in "phase mode one": as shown in FIG. 3E, all of the Josephson junctions attached to output QNO (J3, J4, J5) have one dot on the output side, and the phase of the output QNO is at $2\pi$ radians.

With no input pulses applied at data input DI, any subsequent logical clock reciprocal pulse pairs arriving at logical clock input LCLKI will only trigger escape Josephson junction J5 and will have no effect on the output QNO, as shown in FIGS. 3F-3I. Thus, for example, FIG. 3F shows the arrival of the positive pulse 308 of a second or subsequent logical clock pulse pair at logical clock input LCLKI, in the absence of any input at data input DI. FIG. 3G shows that this pulse 308 triggers escape Josephson junction J5 in the opposite direction (i.e., untriggers escape Josephson junction J5), as illustrated by dots on both sides of escape Josephson junction J5, which dots are both erased in the next drawing, FIG. 3H, consistent with the notation convention that dots on both sides of a Josephson junction are equivalent to no dots at all.

In FIG. 3H, the negative pulse 310 of the second or subsequent logical clock pulse pair arrives at logical clock input LCLKI, still in the absence of any input at data input DI. FIG. 3I shows that this pulse 310 triggers escape Josephson junction J5 negatively, because the DC bias of output Josephson junction J4 is still positive, such that negative pulse 310 is unable to trigger output Josephson junction J4. Thus, circuit 300 is in the same state in FIG. 3I after arrival of second or subsequent negative logical clock pulse 310 as it was in FIG. 3E after the arrival of first negative logical clock pulse 306. As long as the logical clock continues to clock with reciprocal pulse pairs with no data input to DI, circuit 300 sits in the same phase mode value and no output pulse is issued out of inverting output QNO.

FIG. 3J shows a positive SFQ pulse 312 being applied at data input DI. As shown in FIG. 3K, positive data input pulse 312 triggers input Josephson junction J2 positively, propagating pulse 314, which in turn causes stacked Josephson junction J3 to trigger positively, as shown in FIG. 3L. As discussed previously, triggering stacked Josephson junction J3 drives one $\Phi_0$ worth of current into the two bias networks (i.e., up toward DC and AC source bias_1 through inductor L2 and also toward L8 as well), thereby reversing the DC bias seen by output Josephson junction J4, because the return path for both of those loops is through output Josephson junction J4. In this way, the triggering of stacked Josephson junction J3 ends up negatively biasing output Josephson junction J4, thereby obtaining the inversion effect of circuit 300.

In this new bias state, when a reciprocal pulse pair is applied to the logical clock input LCLKI, as shown in FIGS. 3M-3O, the positive logical clock pulse 316, shown in FIG. 3M, triggers escape Josephson junction J5, as shown by the additional dot next to escape Josephson junction J5 in FIG. 3N, and causes no change in the output QNO. However, the subsequent negative logical clock pulse 318, which is also shown in FIG. 3N, triggers output Josephson junction J4 negatively, as shown in FIG. 3O, thus propagating negative output pulse 320, deasserting the output QNO and resetting it to a logical "low" state ("phase mode zero"). This can correspond, for example, to a logical "0" in a larger digital logic device or scheme, such as a memory. Negative output pulse 320 in FIG. 3O corresponds to positive data input pulse 312 in FIG. 3J, as clocked in by negative logical clock input pulse 318. The conversion of the positive input pulse 312 into the negative output pulse 320 demonstrates the inverting functionality of flip-flop circuit 300. This inversion is achieved without the requirement of passing any pulse through an inverter circuit stage.

It may be noted that FIG. 3O includes a dot over stacked Josephson junction J3, indicating a phase change of that Josephson junction as compared to FIG. 3N. Every time output Josephson junction J4 triggers, stacked Josephson junction J3 also triggers in the opposite direction, which is why the DC bias does not reverse. When output Josephson junction J4 previously triggered positively (i.e., as the result of pulse 302), output Josephson junction J4 received a dot on top (as seen in FIG. 3C) while stacked Josephson junction J3 triggered negatively at the same time and received a dot on the bottom (also as seen in FIG. 3C). Here, in FIG. 3O, when output Josephson junction J4 triggers negatively to receive a dot on the bottom (effectively canceling out the previous dot on top of output Josephson junction J4), stacked Josephson junction J3 triggers positively, thus receiving a dot on top.

FIGS. 3P and 3Q illustrate how a subsequent negative data input pulse 322 applied at data input DI can negatively trigger input Josephson junction J2 and, subsequently, stacked Josephson junction J3. This undoes the effects of the positive pulse 312 on data input DI and, as shown in FIG. 3R, returns the DC biases seen by output Josephson junction J4 to the initial state, i.e., the same state shown in FIG. 3A, wherein output Josephson junction J4 is biased positively with bias current flowing down from the bias networks at the top and right of circuit 300 to the ground at the bottom. The next received logical clock pulse pair will therefore restore the circuit to "phase mode one" in the same manner as shown in FIGS. 3B-3E, outputting a positive SFQ pulse, like pulse 304 in FIG. 3C, corresponding to negative data input pulse 322 shown in FIG. 3P.

If, after introducing a positive pulse 312 to data input DI to produce negative output pulse 320 (as shown in FIGS. 3J-3O), further clocking of the circuit is done by provision of additional reciprocal pulse pairs to logical clock input LCLKI in the absence of pulses to data input DI, no phase mode change to circuit 300 will be obtained and no pulses will issue from output QNO. The only product of such additional clocking will be additional triggering and untriggering of escape Josephson junction J5 (similar to, but the inverse of, the behavior illustrated in FIGS. 3F-3I). After circuit initialization, output Josephson junction J4 will only trigger when the circuit is directed to put a new state to the output by provision of an appropriate pulse to data input DI.

Inverting flip-flop 300 uses reciprocal pulse pairs at logical clock input to fully evaluate its data inputs into its outputs. When the data input changes, on the next logical clock pulse pair, one or the other logical clock pulse will be allowed through to the output, depending on which logical state change is demanded by the circuit's previous logical state and the data input. In contrast to the functioning of many other RZ-data-encoded RQL circuits, the two logical clock pulses of a pulse pair are not required to both come within one AC cycle of the biasing network bias_1, but generally speaking, having both pulses of a reciprocal pair come within one AC cycle is advantageous, because separating them further in time would only make circuit 300 operate more slowly. The data input can advantageously be provided at DI so as not to change between the two pulses of any one logical clock reciprocal pulse pair, because, in effect, both pulses of a pulse pair supplied to logical clock input LCLKI sample the data value supplied at data input DI. Relative timing of data and logical clock pulses can be enforced by logic outside of the inverting flip-flop 300, i.e., elsewhere in the system of which flip-flop 300 is a part.

Figure 4:
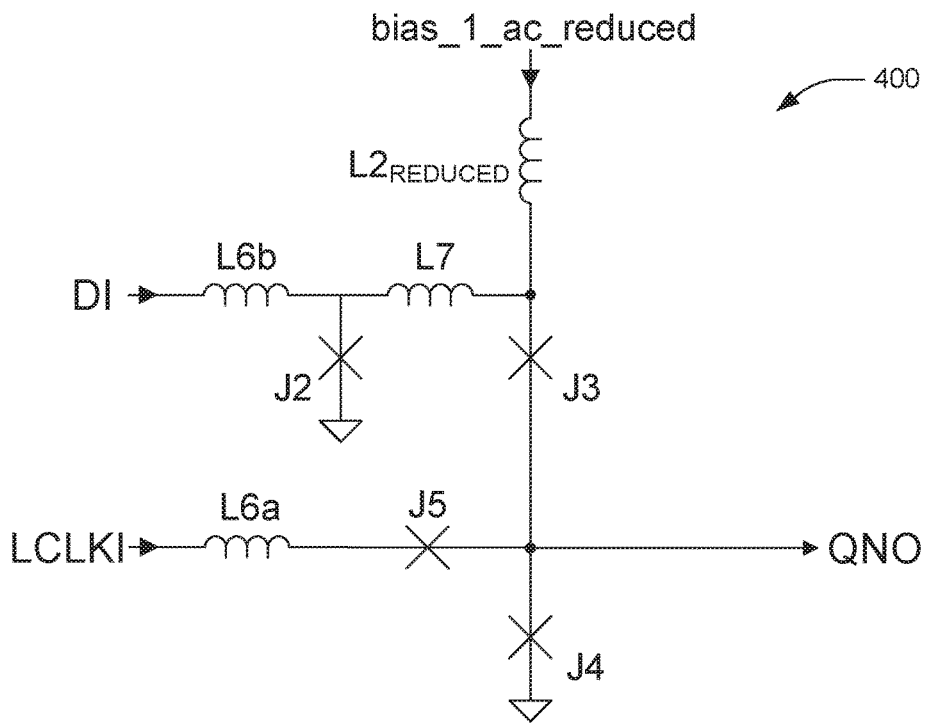
FIGS. 4-6 are circuit diagrams of example inverting RQL phase-mode D flip-flops.

FIG. 4 is a circuit schematic of another example implementation 400 of an RQL PML inverting D flip-flop circuit, similar in structure to circuit 300, but with the elimination of transformer-coupled grounded inductor L8. RQL biasing is usually implemented via transformer coupling to a grounded inductor. Therefore, by reducing the size of bias inductor $L2_{REDUCED}$ in circuit 400 as compared to inductor L2 in circuit 300 and reducing the AC component of DC and AC bias bias_1_ac_reduced in circuit 400 as compared to the AC component of DC and AC bias bias_1 in circuit 300, this DC and AC bias source can effectively be combined in parallel with the DC bias source that would otherwise be supplied by now-eliminated grounded inductor L8, resulting in a smaller circuit. In the DC and AC bias source labeled in bias_1 in circuit 300, there is additional inductance $L_{SOURCE}$ (not shown in the drawings) that is part of the transformers that inject direct and alternating current. This additional inductance $L_{SOURCE}$ is an inductance to ground. Inductor L8 to be eliminated is also an inductance to ground. Thus, the size of $L2_{REDUCED}$ is set by the formula $L8 \| (L2 + L_{SOURCE}) = L2_{REDUCED} + L_{SOURCE}$, or, equivalently, $L2_{REDUCED} = L8 \| L2 + L8 \| L_{SOURCE} - L_{SOURCE}$. In circuit 400 as compared to circuit 300, so that DC and AC bias source bias_1 can provide $\Phi_0/2$ DC and reduced-amplitude AC, the amount of AC power coupled in the AC transformer (not shown) associated with bias_1_ac_reduced is modified so that the total AC bias level provided to Josephson junctions J3 and J4 is still the same in circuit 400 as in circuit 300. The operation of circuit 400 is otherwise the same as previously described for circuit 300. D flip-flop 400 is therefore extremely efficient in terms of its use of devices, requiring only three or four Josephson junctions and only two to four inductors, apart from any devices used for race condition avoidance phasing of input signals, and notably without requiring a separate dedicated signal inversion circuit stage.

Figure 5:
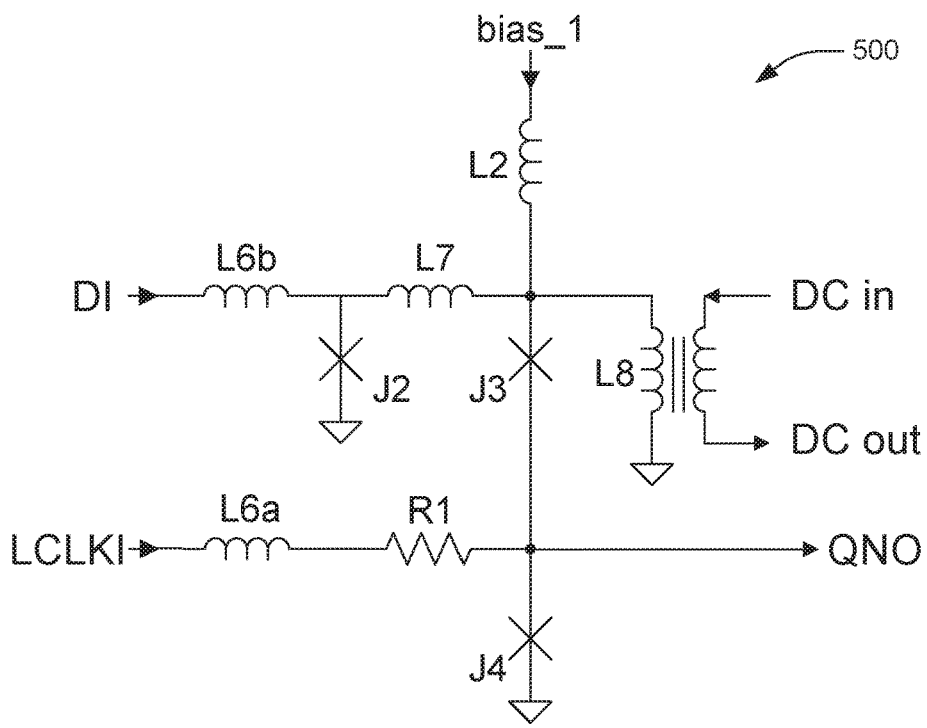

FIG. 5 is a circuit schematic of another example implementation 500 of an RQL PML inverting D flip-flop circuit, similar in structure to circuit 300, but with the substitution of resistor R1 for escape Josephson junction J5. In circuit 300, operating margins are significantly more affected by variations in the size of escape Josephson junction J5 than by variation in sizes of other components in the circuit. In circuit 500, therefore, escape Josephson junction J5 is replaced by a small passive resistor R1. The operation of circuit 500 is substantially the same as previously described for circuit 300, except as follows. In circuit 300, a logical clock input pulse that fails to trigger output Josephson junction J4 is dissipated by triggering escape Josephson junction J5, as shown, for example, in FIGS. 3E, 3G, and 3I (corresponding to dissipated pulses 306, 308, and 310, respectively). By contrast, in circuit 500, any such pulse is dissipated gradually in resistor R1 (e.g., into heat). Resistor R1 can be sized such that the L/R time constant of the loop comprising logical clock input inductor L6a, dissipation resistor R1, output Josephson junction J4, and a logical clock input driving Josephson junction (not shown, but located between LCLKI and ground in FIG. 5) allows the loop to dissipate one $\Phi_0$ worth of current in less than one half of an AC cycle period as supplied by DC and AC bias bias_1, such that the pulse being dissipated does not interfere with the arrival of the next logical clock pulse. For example, the value of resistor R1 can be between about one ohm and about ten ohms, e.g., between about two ohms and about five ohms. As with circuit 300, in circuit 500, AC and DC bias source bias_1 can provide $\Phi_0/2$ worth of direct current plus an AC waveform signal (e.g., a sinusoidal signal), while the DC bias provided through inductor L8 can provide $\Phi_0/2$ worth of direct current. D flip-flop 500 is therefore highly efficient in terms of its use of devices, requiring only two or three Josephson junctions, one resistor, and only three to five inductors, apart from any devices used for race condition avoidance phasing of input signals, and notably without requiring a separate dedicated signal inversion circuit stage.

Figure 6:
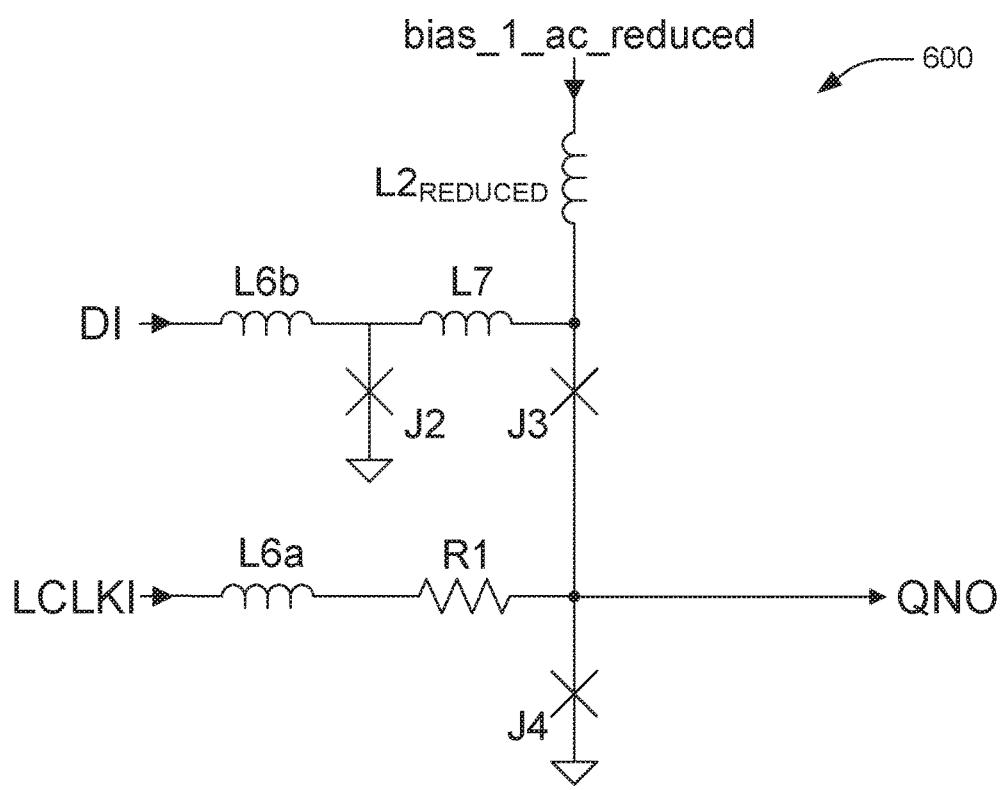

FIG. 6 is a circuit schematic of another example implementation 600 of an RQL PML inverting D flip-flop circuit, similar in structure to circuit 300, but with both the elimination of transformer-coupled grounded inductor L8, as in circuit 400, and the substitution of resistor R1 for escape Josephson junction J5, as in circuit 500. Accordingly, the size of bias inductor L2 is reduced in circuit 600 as compared to circuit 300 and the AC component of AC and DC bias bias_1 is reduced in circuit 600 as compared to circuit 300, as described above with regard to circuit 400. The operation of circuit 600 is otherwise the same as previously described for circuit 300. D flip-flop 600 is therefore extremely efficient in terms of its use of devices, requiring only two or three Josephson junctions, one resistor, and only two to four inductors, apart from any devices used for race condition avoidance phasing of input signals, and notably without requiring a separate dedicated signal inversion circuit stage.

Figure 7A:
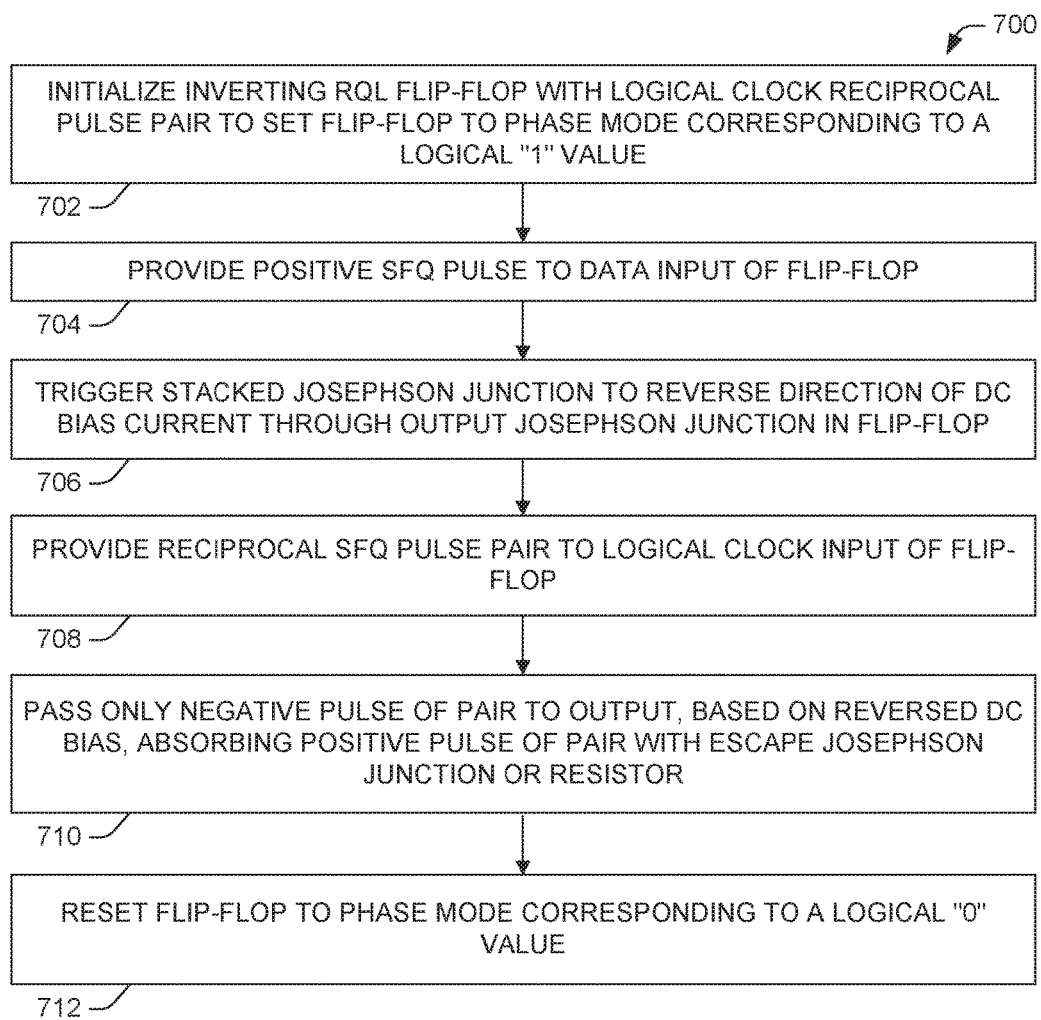
FIGS. 7A-7B are flow diagrams of example methods of operating (e.g., writing and reading values to and from) an inverting RQL phase-mode D flip-flop.

FIG. 7A is a flow chart illustrating a method 700 of operating (e.g., writing and reading a logical value to and from) an inverting RQL phase-mode D flip-flop. The flip-flop can be like those described with reference to FIG. 1, 2, 3A, 4, 5, or 6. An inverting RQL flip-flop is initialized 702 with logical clock reciprocal pulse pair to set the flip-flop (i.e., its output) to a phase mode corresponding to a logical "1" value. A positive SFQ pulse is then provided 704 to a data input of the inverting RQL flip-flop. A stacked Josephson junction in the flip-flop is triggered 706 to reverse the direction of a DC bias current flowing through an output Josephson junction in the flip-flop. Another reciprocal SFQ pulse pair is then provided 708 to a logical clock input of the flip-flop. Only the negative pulse of the logical clock pulse pair is passed 710 to the flip-flop output, based on reversed DC bias. The positive pulse of the logical clock pulse pair is absorbed 710 using either an escape Josephson junction or resistor to absorb that pulse. Thus, the flip-flop is reset 712 to a phase mode corresponding to a logical "0" value. This method can correspond, for example, to the functioning shown in FIGS. 3B-3E and 3J-3O.

Figure 7B:
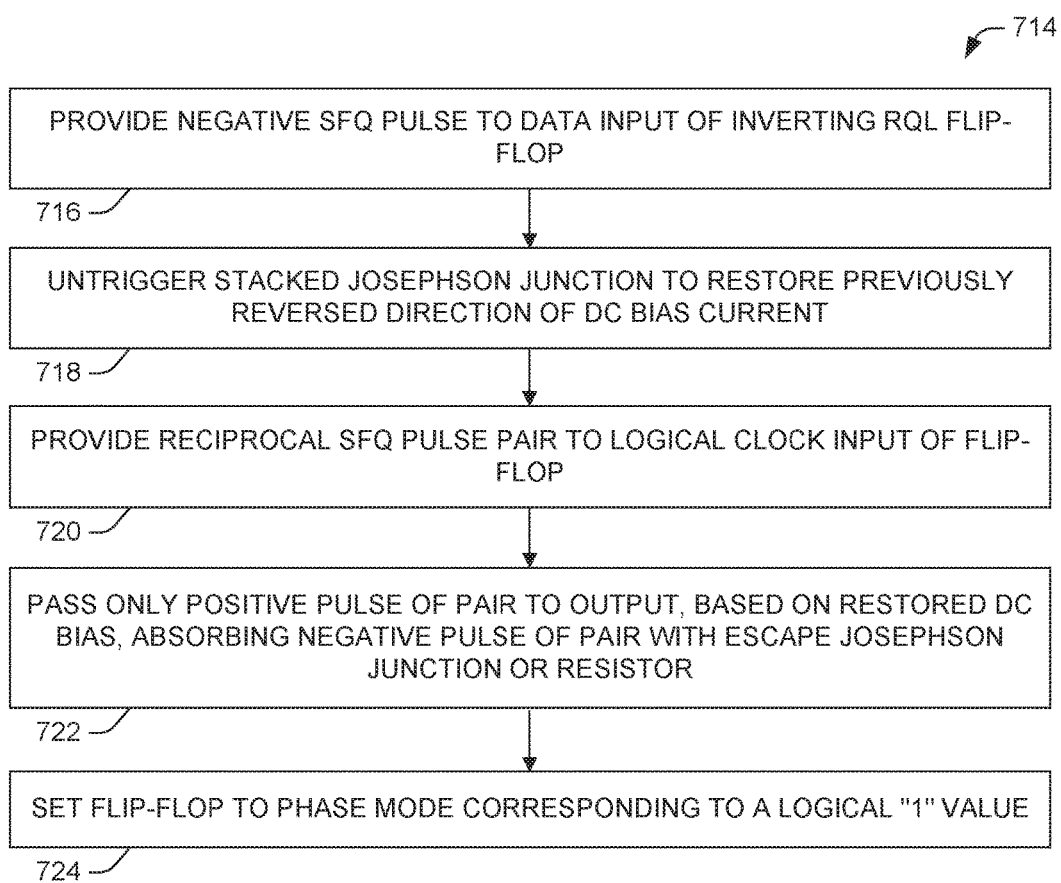

FIG. 7B is a flow chart illustrating a method 714 of operating (e.g., writing and reading a logical value to and from) an inverting RQL phase-mode D flip-flop, that can continue from the method 700 of FIG. 7A. A negative SFQ pulse can be provided 716 to the data input of the inverting RQL flip-flop. This, in turn, untriggers 718 the stacked Josephson junction in the flip-flop to restore the (e.g., previously reversed) direction of the DC bias current flowing through the output Josephson junction in the flip-flop. Then, still another reciprocal SFQ pulse pair can be provided 720 to the logical clock input of the flip-flop. Now, only the positive pulse of the reciprocal pulse pair is passed 722 to the flip-flop output, based on the restored DC bias, while the negative pulse of the pulse pair is absorbed 722 with either an escape Josephson junction or a resistor. The flip-flop is thereby set 724 to a phase mode corresponding to a logical "1" value. This method can correspond, for example, to the functioning shown in FIGS. 3P-3R and 3B-3E.

The present disclosure provides a flip-flop with an inverted output that improves design efficiency by reducing the need for discrete inverters. The inverting flip-flop described herein is both smaller (in terms of part count and chip area required for implementation) and faster (in terms of signal propagation time) than implementations that combine a flip-flop and an inverter. These efficiency improvements lead to smaller die area and a lower cost per die.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. An inverting reciprocal quantum logic (RQL) phase-mode flip-flop comprising:
   a stacked Josephson junction configured to receive a data input signal on a data input line as a positive or a negative single flux quantum (SFQ) pulse and to reverse a DC bias current flowing in the flip-flop based on the data input signal; and
   a comparator configured to receive a logical clock input signal and to either transmit the logical clock input signal on an output line as an output signal of the flip-flop, the output signal being a logical inversion of the data input signal, or to suppress such transmission, based on the direction of the DC bias current and a logical output state of the flip-flop.

2. The flip-flop of claim 1, wherein the output signal is a negative or positive SFQ pulse corresponding to a 0 or $2\pi$ radian superconducting phase of an output Josephson junction in the comparator.

3. The flip-flop of claim 1, wherein the logical clock input signal is provided as reciprocal pairs of positive and negative single flux quantum (SFQ) pulses.

4. The flip-flop of claim 1, further comprising a DC and AC bias network configured to provide the DC bias current to an output Josephson junction in the comparator, and wherein the stacked Josephson junction is configured to reverse the DC bias current by triggering in response to the data input signal.

5. The flip-flop of claim 1, wherein the comparator comprises an escape Josephson junction through which the logical clock input signal is provided, and an output Josephson junction connected between the escape Josephson junction and a circuit ground.

6. The flip-flop of claim 5, wherein the flip-flop includes no more than four Josephson junctions.

7. The flip-flop of claim 5, wherein the comparator is configured such that only one of the escape Josephson junction or the output Josephson junction triggers in response to an SFQ pulse received as the logical clock input signal.

8. The flip-flop of claim 7, wherein the comparator is configured such that the output Josephson junction preferentially triggers to generate the output signal based on a negative bias condition of the output Josephson junction resulting from a triggering of the stacked Josephson junction reversing the DC bias current in response to the data input signal.

9. The flip-flop of claim 1, further comprising DC biasing circuitry comprising a grounded inductor transformer-coupled to a DC bias line, the DC biasing circuitry contributing to the DC bias current biasing the output Josephson junction.

10. The flip-flop of claim 1, wherein the comparator comprises a resistor through which the logical clock input signal is provided, and an output Josephson junction connected between the resistor and a circuit ground, wherein the resistor is configured to gradually dissipate a logical clock input signal pulse that does not trigger the output Josephson junction.

11. The flip-flop of claim 10, wherein the flip-flop includes no more than three Josephson junctions.

12. A method comprising:
   initializing an inverting reciprocal quantum logic (RQL) flip-flop with a logical clock reciprocal pulse pair to set the flip-flop to a phase mode corresponding to a logical "1" value;
   providing a positive single flux quantum (SFQ) pulse to a data input of the flip-flop;
   triggering a stacked Josephson junction in the flip-flop to reverse the direction of a DC bias current flowing through an output Josephson junction in flip-flop;
   providing a further reciprocal SFQ pulse pair to a logical clock input of the flip-flop;
   passing only a negative pulse of the further pulse pair to an output of the flip-flop, based on the reversed DC bias current, and absorbing a positive pulse of the further pulse pair with either an escape Josephson junction or a dissipation resistor; and
   resetting the flip-flop to a phase mode corresponding to a logical "0" value.

13. The method of claim 12, further comprising providing an AC bias signal to the output Josephson junction, and wherein the resistor, if included, is sized such that the L/R time constant of a loop comprising a logical clock input inductor, the dissipation resistor, the output Josephson junction, and a logical clock input driving Josephson junction allows the loop to dissipate one $\Phi_0$ worth of current in less than one half of a cycle of the provided AC bias signal.

14. The method of claim 12, wherein the positive pulse of the further pulse pair is absorbed with an escape Josephson junction, and wherein the negative pulse of the further pulse pair is passed to the output by the triggering of the output Josephson junction in response to the negative pulse of the further pulse pair.

15. The method of claim 12, further comprising:
   providing a negative SFQ pulse to the data input of the inverting RQL flip-flop;
   untriggering the stacked Josephson junction to restore the previously reversed direction of the DC bias current;
   providing a subsequent reciprocal SFQ pulse pair to the logical clock input of the flip-flop;
   passing only a positive pulse of the subsequent pulse pair to the output of the flip-flop, based on the restored DC bias current, and absorbing the negative pulse of the subsequent pulse pair with an escape Josephson junction or resistor; and
   setting the flip-flop to a phase mode corresponding to a logical "1" value.

16. The method of claim 15, wherein the negative pulse of the subsequent pulse pair is absorbed with an escape Josephson junction, and wherein the positive pulse of the subsequent pulse pair is passed to the output by the triggering of the output Josephson junction in response to the positive pulse of the subsequent pulse pair.

17. A circuit comprising:
   a data input configured to receive a data input signal as single flux quantum (SFQ) pulses;
   a logical clock input configured to receive a logical clock input signal as reciprocal pairs of positive and negative SFQ pulses;
   either an escape Josephson junction or a resistor connected between the logical clock input and an output;
   an output Josephson junction connected between the output and a circuit ground;
   a stacked Josephson junction connected between the data input and the output; and
   a DC and AC bias network configured to supply DC and AC bias to the output Josephson junction, the DC bias being reversible by the triggering of the stacked Josephson junction,
   wherein the circuit is configured to provide an output signal corresponding to a logical "1" or logical "0" value out of the output, the output signal being an inverted version of the data input signal as clocked by the logical clock input signal.

18. The circuit of claim 17, further comprising DC biasing circuitry comprising a grounded inductor transformer-coupled to a DC bias line, the DC biasing circuitry contributing to the DC bias current biasing the output Josephson junction.

19. The circuit of claim 17, wherein the circuit includes no more than three Josephson junctions, exclusive of any escape Josephson junction in the circuit.

20. The circuit of claim 17, wherein the output Josephson junction is configured to preferentially trigger to generate the output signal based on a negative bias condition of the output Josephson junction resulting from a triggering of the stacked Josephson junction reversing the DC bias current in response to the data input signal.

* * * * *